United States Patent
Niu et al.

(10) Patent No.: US 11,487,939 B2
(45) Date of Patent: Nov. 1, 2022

(54) SYSTEMS AND METHODS FOR UNSUPERVISED AUTOREGRESSIVE TEXT COMPRESSION

(71) Applicant: salesforce.com, inc., San Francisco, CA (US)

(72) Inventors: Tong Niu, Sunnyvale, CA (US); Caiming Xiong, Menlo Park, CA (US); Richard Socher, Menlo Park, CA (US)

(73) Assignee: Salesforce.com, Inc., San Francisco, CA (US)

(*) Notice: Subject to any disclaimer, the term of this patent is extended or adjusted under 35 U.S.C. 154(b) by 171 days.

(21) Appl. No.: 16/549,985

(22) Filed: Aug. 23, 2019

(65) Prior Publication Data

US 2020/0364299 A1    Nov. 19, 2020

Related U.S. Application Data

(60) Provisional application No. 62/851,043, filed on May 21, 2019, provisional application No. 62/848,415, filed on May 15, 2019.

(51) Int. Cl.
| | |
|---|---|
| *G06F 40/284* | (2020.01) |
| *G06N 3/08* | (2006.01) |
| *H03M 7/42* | (2006.01) |
| *H03M 7/30* | (2006.01) |
| *G06F 40/40* | (2020.01) |

(52) U.S. Cl.
CPC .......... *G06F 40/284* (2020.01); *G06F 40/40* (2020.01); *G06N 3/088* (2013.01); *H03M 7/3084* (2013.01); *H03M 7/42* (2013.01)

(58) Field of Classification Search
CPC ....... G06F 40/284; G06F 40/40; G06N 3/088; H03M 7/42; H03M 7/3084; H03M 7/3059
See application file for complete search history.

(56) References Cited

U.S. PATENT DOCUMENTS

| | | | |
|---|---|---|---|
| 10,282,663 B2 | 5/2019 | Socher et al. | |
| 10,346,721 B2 | 7/2019 | Albright et al. | |
| 10,474,709 B2 | 11/2019 | Paulus | |
| 10,521,465 B2 | 12/2019 | Paulus | |

(Continued)

OTHER PUBLICATIONS

Baziotis et al., "SEQ3: Differentiable Sequence-to-Sequence-to-Sequence Autoencoder for Unsupervised Abstractive Sentence Compression," Conference of the north American chapter of the association for computational linguistics, 2019, pp. 673-681.

(Continued)

*Primary Examiner* — Michael N Opsasnick
(74) *Attorney, Agent, or Firm* — Haynes and Boone LLP

(57) ABSTRACT

Embodiments described herein provide a provide a fully unsupervised model for text compression. Specifically, the unsupervised model is configured to identify an optimal deletion path for each input sequence of texts (e.g., a sentence) and words from the input sequence are gradually deleted along the deletion path. To identify the optimal deletion path, the unsupervised model may adopt a pre-trained bidirectional language model (BERT) to score each candidate deletion based on the average perplexity of the resulting sentence and performs a simple greedy look-ahead tree search to select the best deletion for each step.

18 Claims, 7 Drawing Sheets

(56) References Cited

U.S. PATENT DOCUMENTS

| | | | |
|---|---|---|---|
| 10,565,318 B2* | 2/2020 | Bradbury | G06F 40/216 |
| 10,743,034 B2* | 8/2020 | Xu | H04N 19/117 |
| 2008/0300857 A1* | 12/2008 | Barbaiani | G06F 40/45 |
| | | | 704/4 |
| 2010/0274770 A1* | 10/2010 | Gupta | G06F 16/285 |
| | | | 707/688 |
| 2014/0303973 A1* | 10/2014 | Amarilli | G10L 15/08 |
| | | | 704/235 |
| 2016/0350653 A1 | 12/2016 | Socher et al. | |
| 2017/0024645 A1 | 1/2017 | Socher et al. | |
| 2017/0032280 A1 | 2/2017 | Socher | |
| 2017/0140240 A1 | 5/2017 | Socher | |
| 2018/0013699 A1* | 1/2018 | Sapoznik | G06F 40/205 |
| 2018/0082171 A1 | 3/2018 | Merity et al. | |
| 2018/0096219 A1 | 4/2018 | Socher | |
| 2018/0121787 A1 | 5/2018 | Hashimoto et al. | |
| 2018/0121788 A1 | 5/2018 | Hashimoto et al. | |
| 2018/0121799 A1 | 5/2018 | Hashimoto et al. | |
| 2018/0129931 A1 | 5/2018 | Bradbury et al. | |
| 2018/0129937 A1 | 5/2018 | Bradbury et al. | |
| 2018/0129938 A1 | 5/2018 | Xiong et al. | |
| 2018/0143966 A1 | 5/2018 | Lu et al. | |
| 2018/0144208 A1 | 5/2018 | Lu et al. | |
| 2018/0144248 A1 | 5/2018 | Lu et al. | |
| 2018/0268287 A1 | 9/2018 | Johansen et al. | |
| 2018/0268298 A1 | 9/2018 | Johansen et al. | |
| 2018/0300317 A1 | 10/2018 | Bradbury | |
| 2018/0336198 A1 | 11/2018 | Zhong et al. | |
| 2018/0336453 A1 | 11/2018 | Merity et al. | |
| 2018/0349359 A1 | 12/2018 | Mccann et al. | |
| 2018/0373682 A1 | 12/2018 | Mccann et al. | |
| 2018/0373987 A1 | 12/2018 | Zhang et al. | |
| 2019/0130206 A1 | 5/2019 | Trott et al. | |
| 2019/0130248 A1 | 5/2019 | Zhong et al. | |
| 2019/0130249 A1 | 5/2019 | Bradbury et al. | |
| 2019/0130273 A1 | 5/2019 | Keskar et al. | |
| 2019/0130312 A1 | 5/2019 | Xiong et al. | |
| 2019/0130896 A1 | 5/2019 | Zhou et al. | |
| 2019/0130897 A1 | 5/2019 | Zhou et al. | |
| 2019/0149834 A1 | 5/2019 | Zhou et al. | |
| 2019/0188568 A1 | 6/2019 | Keskar et al. | |
| 2019/0213482 A1 | 7/2019 | Socher et al. | |
| 2019/0251168 A1 | 8/2019 | McCann et al. | |
| 2019/0251431 A1 | 8/2019 | Keskar et al. | |
| 2019/0258714 A1 | 8/2019 | Zhong et al. | |
| 2019/0258901 A1 | 8/2019 | Albright et al. | |
| 2019/0258939 A1 | 8/2019 | Min et al. | |
| 2019/0286073 A1 | 9/2019 | Hosseini-Asl et al. | |
| 2019/0295530 A1 | 9/2019 | Hosseini-Asl et al. | |
| 2019/0362020 A1 | 11/2019 | Paulus et al. | |
| 2019/0362246 A1 | 11/2019 | Lin et al. | |
| 2019/0377792 A1* | 12/2019 | Zhang | G06N 5/022 |

OTHER PUBLICATIONS

Cifka et al., "Eval all, trust a few, do wrong to none: Comparing sentence generation models," arXiv preprint arXiv:1804.07972, 2018.

Devlin et al., "BERT: Pre-training of deep bidirectional transformers for language understanding," arXiv preprint arXiv:1810.04805, 2018.

Filippova et al., "Fast k-best sentence compression." arXiv preprint arXiv:1510.08418, 2015.

Filippova et al., "Overcoming the lack of parallel data in sentence compression," Proceedings of the 2013 conference on empirical methods in natural language processing (EMNLP '13), 2013, pp. 1481-1491.

Handler et al., "Human acceptability judgements for extractive sentence compression," arXiv preprint arXiv:1902.00489, 2019.

Kamigaito et al., "Higher-order syntactic attention network for longer sentence compression," In proceedings of the 2018 conference of the North American chapter of the association for computational linguistics: Human Language Technologies, vol. 1 (Long Papers), 2018, pp. 1716-1726.

Kim et al., "Unsupervised recurrent neural network grammars," Proceedings of NAACL-HLT 2019, pp. 1105-1117.

Liangguo et al., "Can syntax help? improving an LSTM-based sentence compression model for new domains," In Proceedings of the 55th annual meeting of the association for computational linguistics, 2017, pp. 1385-1393.

Silver et al., "Mastering the game of go without human knowledge," Nature, 2017, pp. 354-359.

Stern et al., "Insertion transformer: Flexible sequence generation via insertion operations," arXiv preprint arXiv:1902.03249, 2019.

Zhao et al., "A language model based evaluator for sentence compression," In Proceedings of the 56th annual meeting of the association for computational linguistics (vol. 2: Short Papers), 2018, pp. 170-175.

* cited by examiner

| Sentence | Deleted Tokens | AvgPPL |
|---|---|---|
| i think america is still a fairly crowded country by the way . | - | 5.72 |
| i think america is a fairly crowded country by the way . | still | 5.97 |
| i think america is a crowded country by the way . | fairly | 7.19 |
| i think america is a crowded country . | by the way | 5.96 |
| i think america is a country . | crowded | 7.09 |
| america is a country . | i think | 8.15 |
| america . | is a country | 7.55 |

|  | F1 (#1) | F1 (#2) | CR |
|---|---|---|---|
| Seq2seq with attention | 54.9 | 58.6 | 0.53 |
| Dependency tree+ILP | 58.0 | 61.0 | 0.55 |
| LSTMs+pseudo label | 60.3 | 64.1 | 0.51 |
| Evaluator-LM | 64.5 | 66.9 | 0.50 |
| Evaluator-SLM | 65.0 | 68.2 | 0.51 |
| Deleter | 54.0 | 62.6 | 0.56 |

|  | Readability | Informativeness |
|---|---|---|
| Deleter | 2.88 | 2.95 |
| Annotator #1 | 3.01 | 3.21 |
| Annotator #2 | 3.31 | 3.56 |

FIG. 7B

SYSTEMS AND METHODS FOR UNSUPERVISED AUTOREGRESSIVE TEXT COMPRESSION

CROSS-REFERENCE(S)

The present disclosure claims priority under 35 U.S.C. § 119 to U.S. Provisional Application Nos. 62/848,415, filed on May 15, 2019, and 62/851,043, filed on May 21, 2019, both of which are hereby expressly incorporated by reference herein in their entirety.

TECHNICAL FIELD

The present disclosure relates generally to training and use of machine learning systems and more specifically to unsupervised autoregressive text compression.

BACKGROUND

Text compression converts an input text to a compressed form of data. For example, text compression may be used for summarization of the input text, text editing (if there are unnecessary tokens in the input text), and data augmentation (e.g., the compressed text can be employed as additional training examples in addition to the original text). Existing text compression techniques often adopt a supervised model, which usually requires parallel data inputs and manually devised compression rules to perform text compression on an input text. In some cases, extra syntactic information that is often manually generated, such as parse trees, may also be needed. In addition, existing text compression models only generate one compressed sentence for each source input. Thus, when different styles (e.g. lengths) for the final output are demanded, the text compression model often needs to be retrained from scratch. Thus, the amount of work for preparing compression rules and syntactic information, and model retraining renders the existing text compression approaches inefficient.

BRIEF DESCRIPTION OF THE DRAWINGS

FIG. 3 provides an example table illustrating an optimal deletion path the text compression module identified for the input sentence "I think America is still a fairly crowded country by the way."

FIGS. 7A-7B provide example charts showing performance results of the sentence compression process describer throughout FIGS. 1-6, according to embodiments described herein.

In the figures and appendix, elements having the same designations have the same or similar functions.

DETAILED DESCRIPTION

In view of the need for an efficient text compression mechanism, embodiments described herein provide an unsupervised model for text compression. Specifically, the unsupervised model is configured to identify an optimal deletion path for each input sequence of texts (e.g., a sentence) and words from the input sequence are gradually deleted along the deletion path. For example, the optimal deletion path includes an ordered collection of sentences, of which each intermediate sentence along the path is itself a shorter and coherent version of the original input sentence. To identify the optimal deletion path, the unsupervised model may adopt a pretrained bidirectional language model (e.g., BERT) to score each candidate deletion based on the average perplexity of the resulting sentence and performs a simple greedy look-ahead tree search to select the best deletion for each step.

As used herein, the term "network" may comprise any hardware or software-based framework that includes any artificial intelligence network or system, neural network or system and/or any training or learning models implemented thereon or therewith.

As used herein, the term "module" may comprise hardware or software-based framework that performs one or more functions. In some embodiments, the module may be implemented on one or more neural networks.

Figure 1:
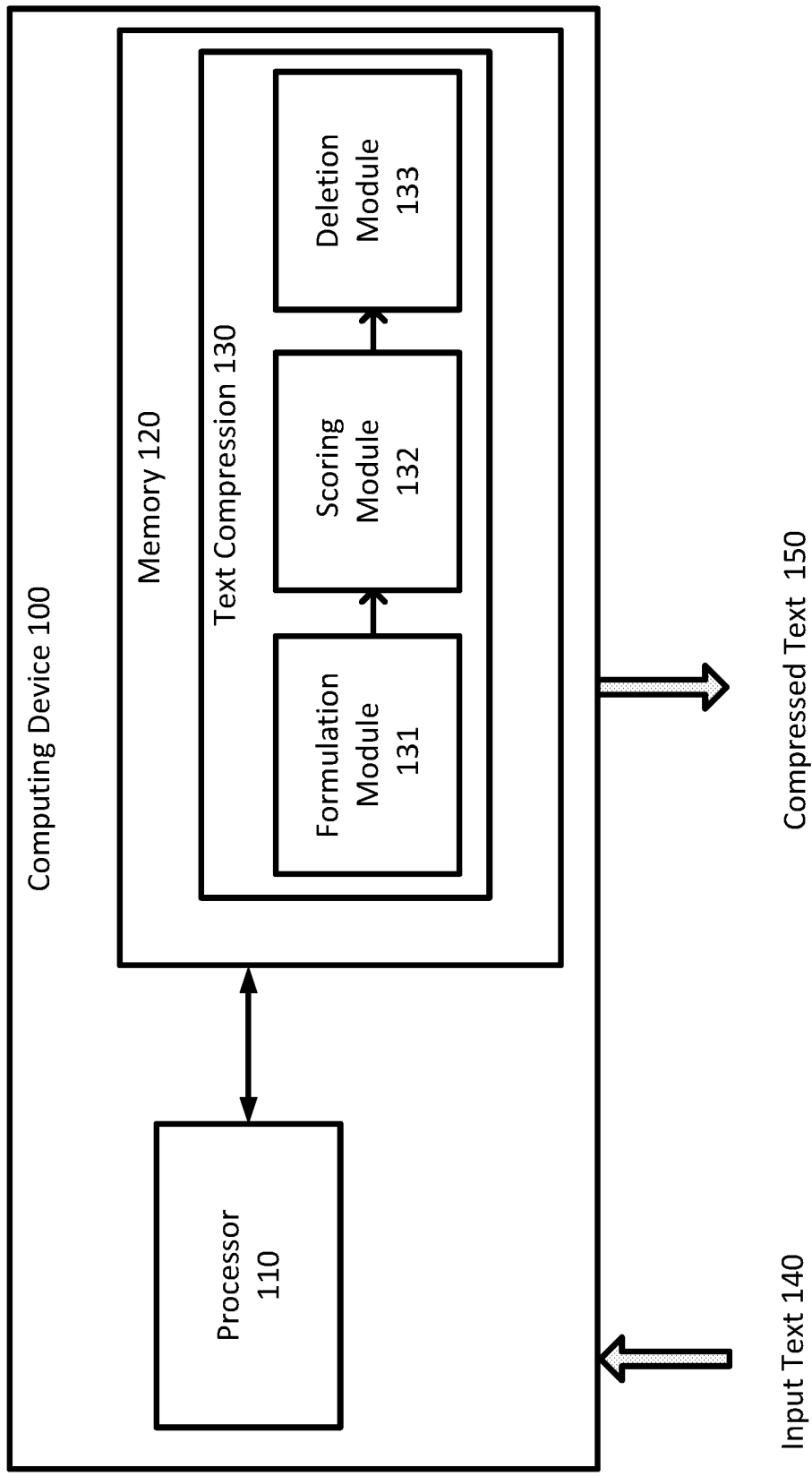
FIG. 1 is a simplified diagram of a computing device implementing a text compression system, according to some embodiments.

FIG. 1 is a simplified diagram of a computing device 100 for implementing a text compression system according to some embodiments. As shown in FIG. 1, computing device 100 includes a processor 110 coupled to memory 120. Operation of computing device 100 is controlled by processor 110. And although computing device 100 is shown with only one processor 110, it is understood that processor 110 may be representative of one or more central processing units, multi-core processors, microprocessors, microcontrollers, digital signal processors, field programmable gate arrays (FPGAs), application specific integrated circuits (ASICs), graphics processing units (GPUs) and/or the like in computing device 100. Computing device 100 may be implemented as a stand-alone subsystem, as a board added to a computing device, and/or as a virtual machine.

Memory 120 may be used to store software executed by computing device 100 and/or one or more data structures used during operation of computing device 100. Memory 120 may include one or more types of machine readable media. Some common forms of machine readable media may include floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which a processor or computer is adapted to read.

Processor 110 and/or memory 120 may be arranged in any suitable physical arrangement. In some embodiments, processor 110 and/or memory 120 may be implemented on a same board, in a same package (e.g., system-in-package), on a same chip (e.g., system-on-chip), and/or the like. In some embodiments, processor 110 and/or memory 120 may include distributed, virtualized, and/or containerized computing resources. Consistent with such embodiments, processor 110 and/or memory 120 may be located in one or more data centers and/or cloud computing facilities.

In some examples, memory 120 may include non-transitory, tangible, machine readable media that includes executable code that when run by one or more processors (e.g., processor 110) may cause the one or more processors to perform the methods described in further detail herein. For example, as shown, memory 120 includes instructions for a text compression module 130 that may be used to implement and/or emulate the systems and models, and/or to implement any of the methods described further herein. In some examples, the text compression module 130 may be used to perform text compression in the input text 140, e.g., one or more sentences. The text compression may be used for providing a summary of the input text 140, editing the input text 140 by removing redundant words or information, and/or the like. In some examples, the text compression module 130 may also handle the iterative training and/or evaluation of a system or model used for text compression tasks.

In some embodiments, the text compression module 130 includes a formulation module 131, a scoring module 132 and a deletion module 133, which may be serially connected or connected in other manners. In some examples, the text compression module 130 and the sub-modules 131-133 may be implemented using hardware, software, and/or a combination of hardware and software.

As shown, computing device 100 receives input such as a natural language text 140, which is provided to the text compression module 130. For example, the input text 140 may include one or more sentences in an unstructured raw textual format. The text compression module 130 operates on the input text 140 via the formulation module 131, the scoring module 132 and the deletion module 133 to generate an output of a compressed text 150 corresponding to the input text 140, representing a summary of the input text 140, an abbreviated version of the input text 140, etc.

According to some embodiments, the text compression module 130 is configured to adopt a progressive lookahead greedy tree search based on BERT to progressively eliminate words or tokens from the input text 140 along an optimal deletion path. The optimal deletion path is defined as an ordered collection of sentences. The first sentence is the original sentence, and each sentence after that is a sub-sequence of the previous one. The optimal deletion path ends when the final sentence satisfies a termination condition, and the final sentence is output as the compressed text 150.

Figure 2:
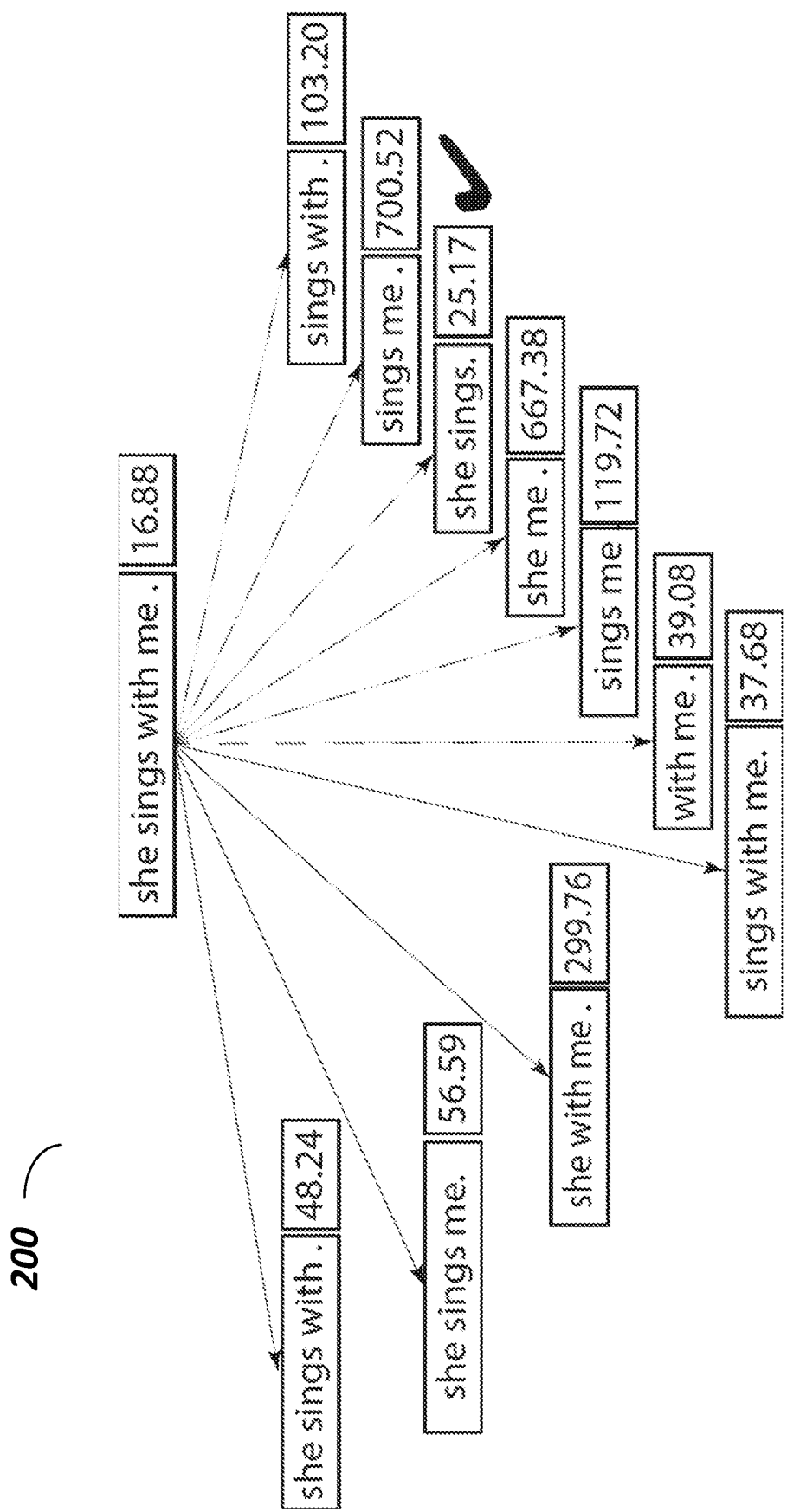
FIG. 2 is an example diagram illustrating a part of an acyclic graph generated by the formulation module for progressive lookahead greedy search probes by the deletion module, according to some embodiments described herein.

To obtain an optimal deletion path of a sentence of the input text 140, the formulation module 131 is configured to formulate the task of finding an optimal deletion path as a search problem in a directed acyclic graph. For example, FIG. 2 shows an example graph 200, that has a plurality of nodes. Each node in this graph 200 is either the original sentence itself (i.e., the root node) or a subsequence of it at the token level. Each node has outgoing edges pointing to sentences resulting from different ways of deletions from the current sentence at the respective node. Each edge is associated with a cost, which is the average perplexity score of each token in the sentence assigned by BERT. An optimal deletion path on the directed acyclic graph is a path of nodes that have the minimum average scores of all nodes along the path.

The scoring module 132 is configured, in some embodiments, to employ a pretrained BERT to score each intermediate sentence along a deletion path in the directed acyclic graph. In some embodiments, a pretrained BERT model is used to assign a negative log likelihood for each token so that a score for each intermediate sentence at a respective node can be obtained. The scoring module 132 is configured to score each intermediate sentence according to several rules: (1) when having the same parent node, a grammatical sentence is assigned a higher score than an ungrammatical one; and (2) the score is indicative of the time point when the deletion process is to be terminated (i.e., when the simplest possible subsequence is obtained).

The deletion module 133 is configured, in some embodiments, to use progressive lookahead greedy search probes to probe for the next best deletion, e.g., the next node on the directed acyclic graph. As shown in FIG. 2, the dotted arrows correspond to the second iteration of probing when the first iteration (solid arrows) does not locate a good deletion candidate. The deletion module 133 then chooses the sentence with the lowest average perplexity score (the one with a check mark on the right). The deletion module 133 is configured to continue probing for the next best deletion until a termination condition is met. For example, when the first sharpest percentage increase (e.g., 4%, etc.) in the average perplexity score after deletion is met, the deletion process may be terminated.

FIG. 2 is an example diagram 200 illustrating a part of an acyclic graph generated by the formulation module 131 for progressive lookahead greedy search probes by the deletion module 133, according to some embodiments described herein. The graph 200 has a root node representing an input sentence "she sings with me," which has a token score of 16.88. The root node has a plurality of child nodes, each representing an intermediate sentence after deletion of one or more tokens, e.g., "she sings with," "sings me," etc. Each intermediate sentence, e.g., the child node, is associated with an average perplexity (AvgPPL) score. During an iteration, the sentence "she sings." with the lowest average perplexity score of 25.17 is selected as the next step deletion from the input sentence (root node). The next step deletion shown at graph 200 is for illustrative purpose only. For example, each child node in graph 200 may have several child nodes for next step deletion. Further details of determining the AvgPPL score to determine a candidate sentence for the next step deletion is provided in relation to FIG. 5.

FIG. 3 provides an example table illustrating an optimal deletion path the text compression module 130 identified for the input sentence "I think America is still a fairly crowded country by the way." As shown in Table 300, tokens such as "still," "fairly," "by the way," etc. are progressively deleted from the sentence based on the AvgPPL score of the tokens. In addition, Table 300 shows the full deletion path from the original input sentence to the final compressed sentence, making the compression process more comprehensible and controllable. For example, certain key words may be "frozen" from the original sentence in order not to be deleted, or a certain minimum/maximum compression ratio may be enforced by mandatorily terminating the deletion path.

Figure 4:
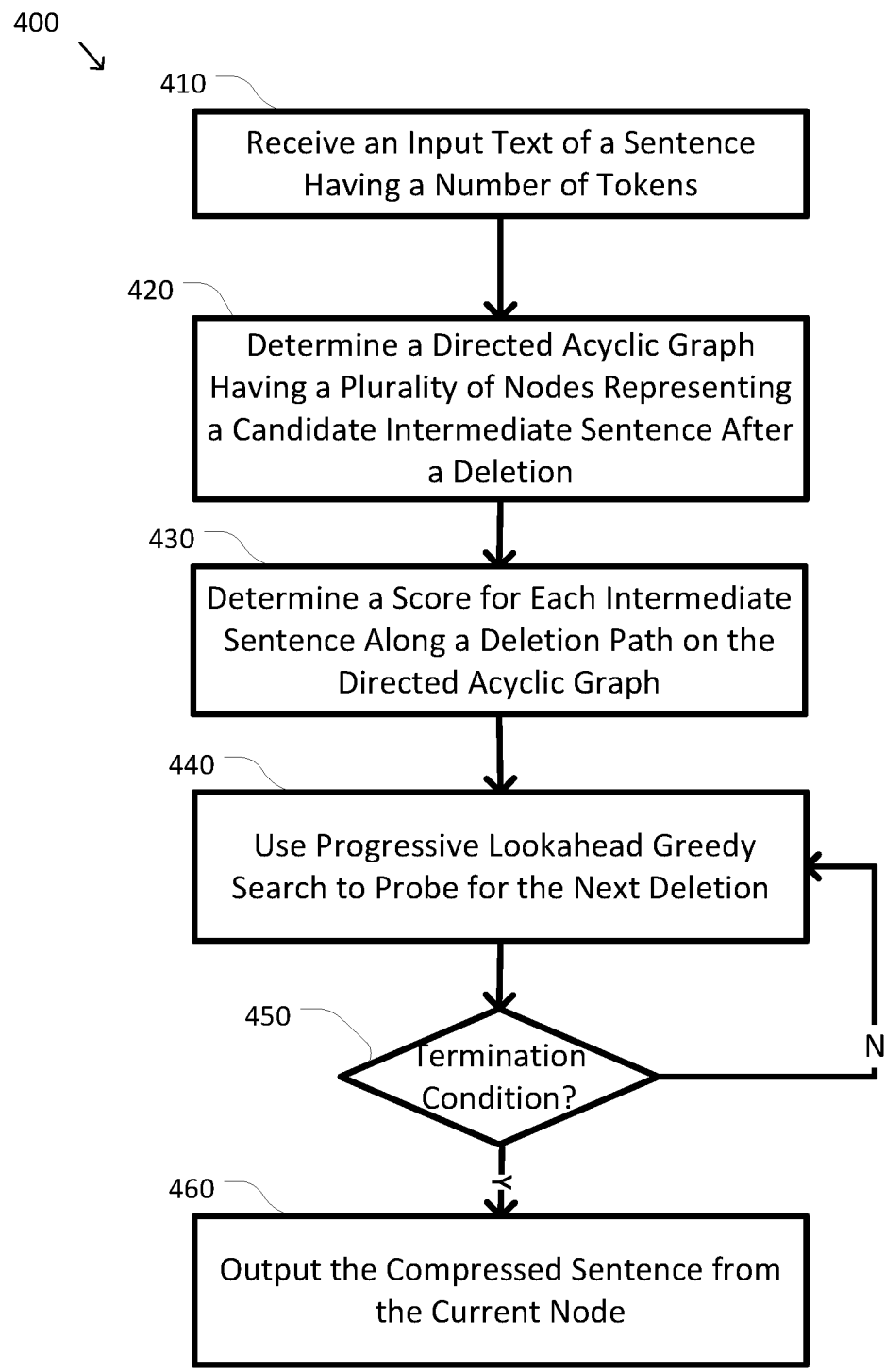
FIG. 4 is a simplified logic flow diagram illustrating a method for generating an optimal deletion path for an input text, according to some embodiments.

FIG. 4 is a simplified logic flow diagram illustrating a method 400 for generating an optimal deletion path for an input text, according to some embodiments. One or more of the processes 410-460 of method 400 may be implemented, at least in part, in the form of executable code stored on non-transitory, tangible, machine-readable media that when run by one or more processors may cause the one or more processors to perform one or more of the processes 410-460. In some embodiments, method 400 may correspond to the method used by the text compression module 130 to perform different text compression tasks using the generated optimal deletion path.

At a process 410, an input text of a sentence having a number of tokens is received. For example, as shown in FIG.

3, the first row of sentence "I think America is still a fairly crowded country by the way" in table 300 may represent a received sentence. In some embodiments, the input text of a sentence may be received via a user interface, a voice input interface, etc.

At a process 420, a directed acyclic graph is determined based on the input text. For example, as shown in FIG. 2, the graph has a plurality of nodes representing a candidate intermediate sentence after a deletion.

At a process 430, a score for each intermediate sentence along a deletion path on the directed acyclic graph is determined. For example, the scoring module 132 may employ a pretrained BERT model to score each intermediate sentence.

At a process 440, progressive lookahead greedy search is used to probe for the next deletion. For example, as shown in FIG. 2, a candidate deletion resulting in the intermediate sentence "she sings." is selected.

At a process 450, when the termination condition is met, the method 400 proceeds to process 460 to output the compressed sentence from the current node. Otherwise, when the termination condition is not met, the method 400 proceeds to process 440 to continue searching for the next deletion on the graph. For example, the termination condition may be pre-programmed as a minimum number of words that are left in the compressed sentence, a ratio between the compressed sentence and the input sentence, etc. For another example, the termination condition may be a certain grammatical sentence structure of the compressed sentence, e.g., the final compressed sentence is defined as a form of "subject+verb+object," etc.

Figure 5:
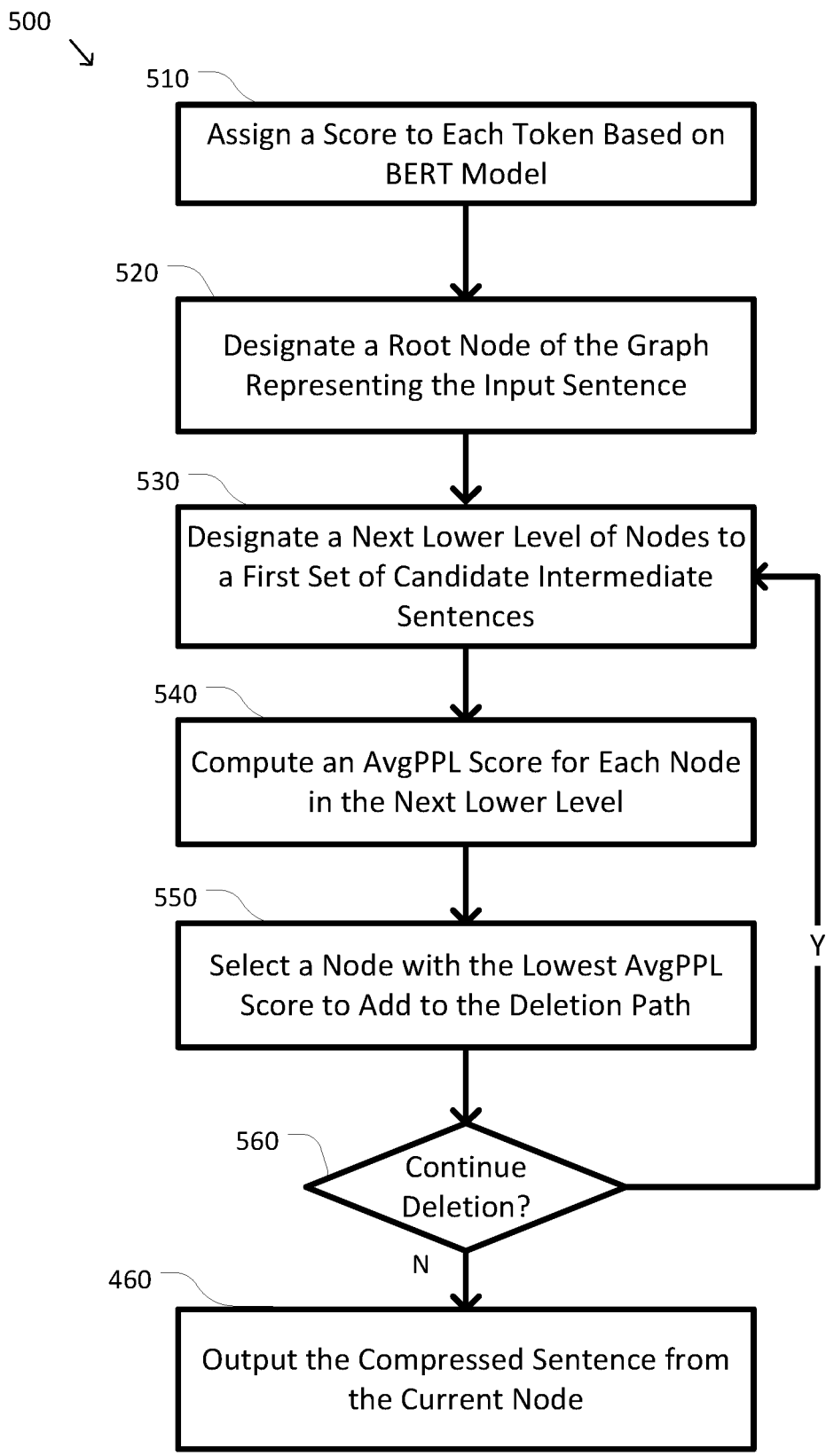
FIG. 5 is a simplified logic flow diagram illustrating a method for determining a graph representation for an input sentence and scoring candidate sentences for the next deletion step, according to some embodiments.

FIG. 5 is a simplified logic flow diagram illustrating a method 500 for determining a graph representation for an input sentence and scoring candidate sentences for the next deletion step, according to some embodiments. One or more of the processes 510-560 of method 500 may be implemented, at least in part, in the form of executable code stored on non-transitory, tangible, machine-readable media that when run by one or more processors may cause the one or more processors to perform one or more of the processes 510-560. In some embodiments, method 500 may correspond to the method used by the text compression module 130 to perform different text compression tasks using the generated optimal deletion path.

At process 510, a score is assigned to each token in the original input sentence based on the BERT model. For example, a pretrained BERT model is used to assign a negative log likelihood for each token in a sentence to derive a score for each intermediate sentence.

At process 520, a root node representing the input sentence is designated for the graph. For example, the root node of graph 200 shown in FIG. 2 corresponds to an input sentence of "she sings with me."

At process 530, a next lower level of node is designated to a set of candidate intermediate sentences after deleting one or more tokens from the original input sentence. For example, given a sentence, there are finite possible tokens that can be deleted until all tokens are deleted. Thus, as shown in the graph 200 in FIG. 2, from the sentence "she sings with me," there are a number of possibilities to delete one or two tokens from the sentences. The remaining candidate sentences after the deletion form the next lower level of nodes. The root node has outgoing edges pointing to each sentence resulting from a deletion of the root node.

At process 540, an AvgPPL score is computed for each node in the next lower level. Specifically, each edge connecting the respective node and the node in the upper level is associated with a "cost" of the deletion following the specific edge, which can be quantified by the AvgPPL score. The AvgPPL score is calculated as:

$$AvgPPL = \exp\left(-\sum_{i=1}^{m} \log T_i - \sum_{i=1}^{n} \log D_i\right)$$

Here, $\{T_i, I=1, \ldots m\}$ are the set of tokens present in the candidate sentence and $\{D_i, I=1, \ldots, n\}$ refer to the collection of all deleted tokens deleted from the original input sentence. This second component relating to $D_i$ is crucial to the algorithm because otherwise the model would prefer to delete rarer tokens, whose unigram probabilities are lower (i.e., of higher negative log likelihood). In this way, a lower AvgPPL score indicates a more syntactically coherent sentence and may be more likely to be chosen for the deletion path.

At process 550, the node with the lowest AvgPPL score is chosen to be added to the deletion path. For example, as shown in graph 200 in FIG. 2, the node "she sings" having an AvgPPL score of 25.17 is the lowest among all candidate sentences and is chosen to be added to the deletion path.

At process 560, method 500 may determine whether to continue the deletion. For example, a pre-determined termination condition may be applied to determine whether the deletion is to be continued. If the deletion is to be continued, method 500 proceeds to process 530, at which a next lower level nodes are determined for the chosen node at process 550, e.g., to iteratively start another round of deletion through processes 530-550. In this way, the resulting deletion path is optimal as the average score of all nodes along the path is minimized.

If another round of deletion is not to be continued, method 500 may proceed to process 460 in FIG. 4.

Figure 6:
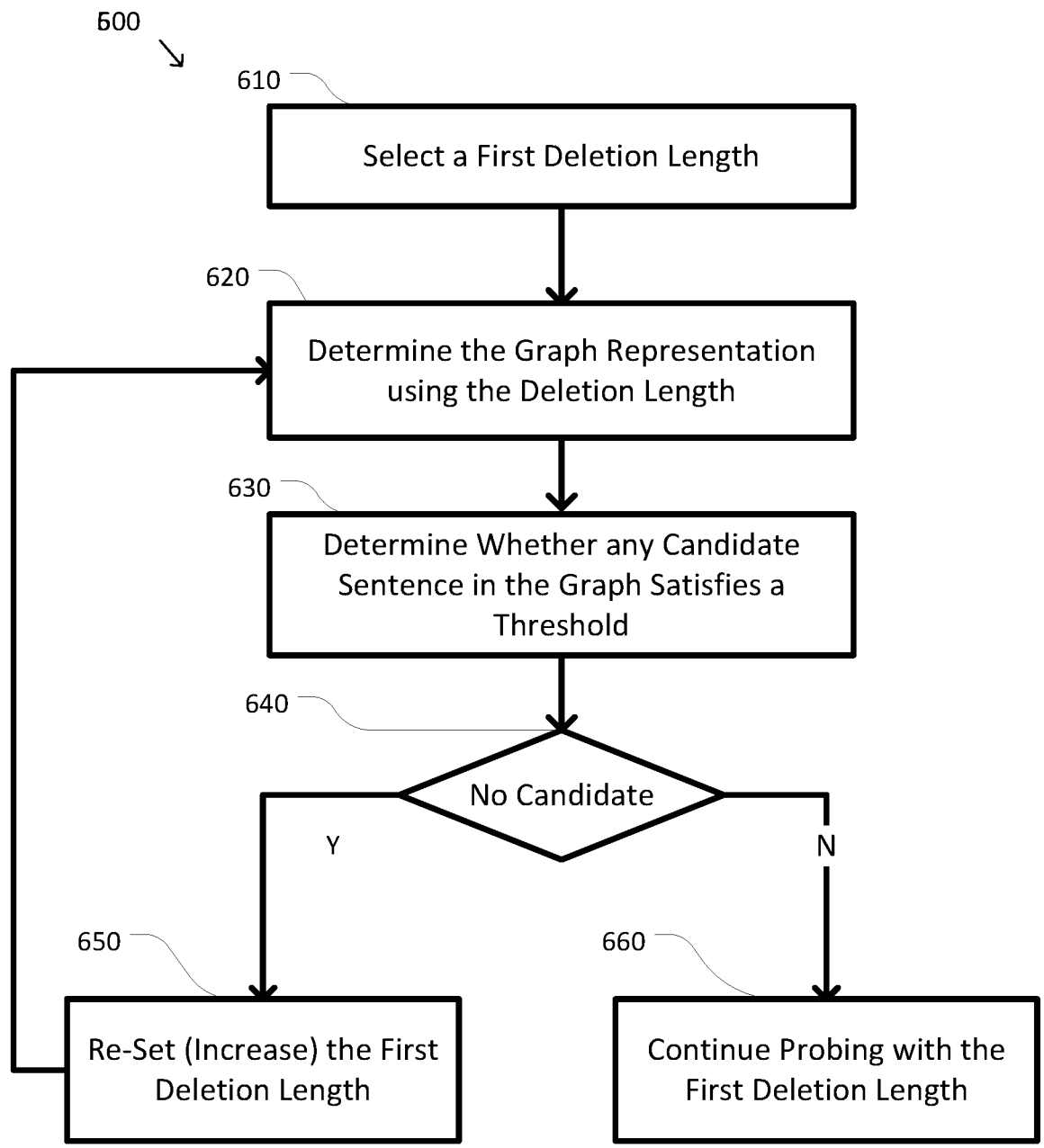
FIG. 6 is a simplified logic flow diagram illustrating a method for progressive lookahead greedy search, according to some embodiments.

FIG. 6 is a simplified logic flow diagram illustrating a method 600 for progressive lookahead greedy search, according to some embodiments. One or more of the processes 610-660 of method 600 may be implemented, at least in part, in the form of executable code stored on non-transitory, tangible, machine-readable media that when run by one or more processors may cause the one or more processors to perform one or more of the processes 610-660. In some embodiments, method 600 may correspond to the method used by the text compression module 130 to perform different text compression tasks using the generated optimal deletion path.

At process 610, a first deletion path may be selected. For example, the progressive lookahead greedy search allows deleting multiple tokens at a time, but naively probing for deletions consisting of multiple tokens may result in computation workload scaling with $O(m^k)$, where m is the number of tokens in the current intermediate sentence and k is the maximum deletion length for each step. Thus a progressive approach is adopted to help reduce the search space. For each deletion step, deletions of the first length, e.g., one token, are performed.

At process 620, the graph representation is determined based on the first deletion length. For example, as shown at graph 200 in FIG. 2, starting from the input sentence "she sings with me," method 600 may probe candidate sentences that removes one token from the input sentence (shown in solid edges).

At process 630, method 600 may determine whether any candidate sentence based on the first deletion length satisfies a threshold. For example, if no candidate sentence of removing one token from the input sentence obtains a score below a threshold, the lookahead deletion length is increased to 2, as shown in the dashed edges in graph 200 of FIG. 2. A candidate is above this threshold if:

$$\frac{AvgPPL_{i+1}}{AvgPPL_i} > 1 + \alpha \log(L_{root})$$

where $\alpha$ (e.g., $\alpha=0.04$, etc.) is a hyperparameter controlling the extent of increase on AvgPPL for each deletion step; and $AvgPPL_i$ and $AvgPPL_{i+1}$ denote the AvgPPL scores of two adjacent nodes on the deletion path. The lower $\alpha$ is set, the better compression quality may be achieved (with the price of a slower convergence). $L_{root}$ is the number of tokens in the original input sentence. As shorter sentences tend to have lower percentage of increase on AvgPPL during deletion, in which case the threshold is to be lowered. Note that during inference, this threshold also functions as the termination condition in case only one sentence is selected from the deletion path (e.g. for sentence compression as shown in FIG. 3).

At process 640, if there is at least one candidate sentence that satisfies the threshold condition, method 600 proceeds to process 660 to continue probing with the first deletion length. For example, method 600 may select the candidate sentence with the minimum AvgPPL score as described in process 550.

At process 640, if there is no candidate sentence that satisfies the threshold condition, method 600 proceeds to process 650, where method 600 may re-set (increase) the first deletion length. For example, as shown at graph 200 in FIG. 2, when no candidate sentence of removing one token from the input sentence obtains a score below the threshold, the lookahead deletion length is increased to 2 to generate a set of candidate sentences with 2 tokens removed from the input sentence, as shown in the dashed edges.

The progressive probing process may continue from process 650 to process 620, with the newly re-set deletion length and repeat the processes 630-660. In some embodiments, deleting multiple tokens at a time may not be encouraged, as the deletion process is to be designed as a gradual process to achieve more intermediate compressions. In this case, the AvgPPL may be multiplied by a parameter $L_s^{62}$ when probing for the next deletion, where Ls is the length of the current sentence and $\beta$ (e.g., $\beta=0.04$, etc.) indicates a degree describing how "gradual" the deletion process is to proceed.

FIGS. 7A-7B provide example charts showing performance results of the sentence compression process describer throughout FIGS. 1-6, according to embodiments described herein. In some embodiments, a pretrained BERT uncased model is used to score each token in the input sentence. To score any token in a sentence, a special token [mask] is used to mask out the target token, and then a token [CLS] is prepended and a token [SEP] is appended to the masked target token, which function as the [START] and [END] tokens. Both tokens are used to evaluate whether the current first or last token can function as a sentence start or end. In this way, the input sentence of tokens can be processed from both directions. Each token is masked one at a time to obtain the negative log probability of each. In some embodiments, the maximum lookahead length is set to 3 to facilitate deletion of phrases which contain multiple tokens, such as "by the way".

Tables 700a-b are based on experimental results on two datasets: a Google sentence compression dataset contains 200, 000 training examples, information of compression labels, part-of-speech (POS) tags, and dependency parsing information for each sentence (used in K. Filippova and Y. Altun, Overcoming The Lack Of Parallel Data In Sentence Compression, 2013). Specifically, the first 1, 000 sentences of evaluation set are used as a test set. The Gigaword dataset (used in C. Napoles, M. Gormley, and B. Van Durme, Annotated gigaword, In Proceedings of the Joint Workshop on Automatic Knowledge Base Construction and Web-scale Knowledge Extraction, pages 95-100, 2012) has 1.02 million examples, where the first 200 are labeled for extractive sentence compression by two annotators.

The metric "F1 score" used in Wang et al., CAN SYNTAX HELP? IMPROVING AN LSTM-BASED SENTENCE COMPRESSION MODEL FOR NEW DOMAINS, In Proceedings of the 55th Annual Meeting of the Association for Computational Linguistics (Volume 1: Long Papers), pages 1385-1393 is used to evaluate the performance of the compression models. Although F1 can be indicative of how well a com-pression model performs, there could be multiple viable compressions for the same sentence, which single-reference ground-truth may not cover. Thus to faithfully evaluate the quality of the compressions generated by the compression model described herein, human studies are conducted on the Gigaword dataset with Amazon Mechanical Turk (MTurk).

Specifically, 150 examples are sampled from the test set, and the generated output from the compression model described herein (denoted by "Deleter") is compared with two existing compressions created by the two annotators. The three compressions were randomly shuffled to anonymize model identity. In addition, readability and informativeness are used as criteria on a five-point Likert scale.

As shown in Table 700a in FIG. 7A, F1 scores on both Google and Gigaword dataset are reported for different compression models (compared with the "Deleter" model described herein). The compression ratio is also shown in Table 700a. As shown in Table 700a, the F1 scores for the Deleter model is competitive (esp. for Annotator #2) existing supervised models trained on 1.02 million examples with similar compression ratio.

As shown in Table 700b in FIG. 7B, the readability and informativeness of the compression model described herein is close to that of Annotator #1, although the informativeness performances are quite different. This is expected because our model is syntax-aware rather than semantic-aware. For example, the compression model described herein would readily delete negation words (e.g., from "i do not love NLP" to "i do love NLP"), which usually causes abrupt change in meaning.

Some examples of computing devices, such as computing device 100 may include non-transitory, tangible, machine readable media that include executable code that when run by one or more processors (e.g., processor 110) may cause the one or more processors to perform the processes of method 300. Some common forms of machine readable media that may include the processes of method 300 are, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, and/or any other medium from which a processor or computer is adapted to read.

This description and the accompanying drawings that illustrate inventive aspects, embodiments, implementations, or applications should not be taken as limiting. Various mechanical, compositional, structural, electrical, and operational changes may be made without departing from the spirit and scope of this description and the claims. In some instances, well-known circuits, structures, or techniques have not been shown or described in detail in order not to obscure the embodiments of this disclosure. Like numbers in two or more figures represent the same or similar elements.

In this description, specific details are set forth describing some embodiments consistent with the present disclosure. Numerous specific details are set forth in order to provide a thorough understanding of the embodiments. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure. In addition, to avoid unnecessary repetition, one or more features shown and described in association with one embodiment may be incorporated into other embodiments unless specifically described otherwise or if the one or more features would make an embodiment non-functional.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

What is claimed is:

1. A method for unsupervised text compression, the method comprising:
   receiving an input sentence having a plurality of tokens;
   assigning a score to each token in the plurality of tokens based on a pretrained bidirectional language model;
   determining a directed acyclic graph representation having a plurality of nodes based on assigned scores, at least one node representing a candidate intermediate sentence after deleting one or more tokens from the input sentence;
   progressively searching for a next deletion on the directed acyclic graph representation via progressive lookahead greedy search;
   determining a deletion path comprising an ordered collection of intermediate sentences, at least one intermediate sentence along the deletion path represents a shorter version of a previous intermediate sentence, from the progressive lookahead greedy search, wherein each node on the deletion path in the directed acyclic graph points to a candidate intermediate sentence after deleting one or more tokens from the input sentence at the respective node; and
   generating a compressed sentence following the deletion path that progressively deletes tokens from the input sentence.

2. The method of claim 1, wherein assigning the respective average perplexity score based on the respective candidate intermediate sentence comprises:
   determining a first set of tokens present in the respective candidate intermediate sentence;
   determining a second set of tokens that have been deleted from the input sentence to result in the respective candidate intermediate sentence; and
   calculating the respective average perplexity score based on a sum of logarithms of scores corresponding to the first set of tokens and scores corresponding to the second set of tokens.

3. The method of claim 1, wherein determining the directed acyclic graph representation comprises:
   designating a root node of the directed acyclic graph representing the input sentence;
   designating a first lower level of nodes that are directly connected to the root node to a first set of candidate intermediate sentences, respectively, each candidate intermediate sentence from the first set being obtained after deleting the one or more tokens from the input sentence; and
   for each outgoing edge connecting from the root node to one of the first lower level of nodes, assigning a respective average perplexity score based on a respective candidate intermediate sentence.

4. The method of claim 3, wherein progressively searching for the next deletion on the directed acyclic graph representation via progressive lookahead greedy search comprises:
   determining a first node from the first lower level corresponding to a first next candidate intermediate sentence having a first minimum average perplexity score among the first set of candidate intermediate sentences the next deletion; and
   adding the first node to the deletion path.

5. The method of claim 4, further comprising:
   designating a second lower level of nodes that are directly connected to the first node to a second set of candidate intermediate sentences, respectively, each candidate intermediate sentence from the second set being obtained after further deleting one or more tokens from the first next candidate intermediate sentence;
   determining a second node from the second lower level corresponding to a second next candidate intermediate sentence having a second minimum average perplexity score among the second set of candidate intermediate sentences the next deletion; and
   adding the second node to the deletion path.

6. The method of claim 1, wherein progressively searching for a next deletion on the directed acyclic graph representation via progressive lookahead greedy search comprises:
   setting a first deletion length; and
   determining the directed acyclic graph representation having the plurality of nodes corresponding to candidate intermediate sentences based on the first deletion length;
   determining whether at least one candidate intermediate sentence from the directed acyclic graph representation corresponds to a score that satisfies a predetermined threshold condition; and
   in response to determining that no candidate intermediate sentence from the directed acyclic graph representation has the score satisfying the predetermined threshold condition, re-setting the first deletion length to a second deletion length that is greater than the first deletion length.

7. The method of claim 6, wherein the predetermined threshold condition includes: a ratio between a first average perplexity score corresponding to a next probing step and a second average perplexity score corresponding to a current probing step is greater than a pre-determined threshold.

8. The method of claim 7, further comprising:
applying a parameter relating to the length of the current sentence to the first average perplexity score while evaluating the predetermined threshold condition.

9. The method of claim 8, further comprising:
tuning the parameter to control an extent of deletion rate of the deletion path.

10. A system for unsupervised text compression, the system comprising:
a memory containing machine readable medium storing machine executable code; and
one or more processors coupled to the memory and configurable to execute the machine executable code to cause the one or more processors to:
receive an input sentence having a plurality of tokens;
assign a score to each token in the plurality of tokens based on a pretrained bidirectional language model;
determine a directed acyclic graph representation having a plurality of nodes based on assigned scores, at least one node representing a candidate intermediate sentence after deleting one or more tokens from the input sentence;
progressively search for a next deletion on the directed acyclic graph representation via progressive lookahead greedy search;
determine a deletion path comprising an ordered collection of intermediate sentences, at least one intermediate sentence along the deletion path represents a shorter version of a previous intermediate sentence, from the progressive lookahead greedy search, wherein each node on the deletion path in the directed acyclic graph points to a candidate intermediate sentence after deleting one or more tokens from the input sentence at the respective node; and
generate a compressed sentence following the deletion path that progressively deletes tokens from the input sentence.

11. The system of claim 10, wherein the machine executable code further causes the one or more processors to assign the respective average perplexity score based on the respective candidate intermediate sentence by:
determining a first set of tokens present in the respective candidate intermediate sentence;
determining a second set of tokens that have been deleted from the input sentence to result in the respective candidate intermediate sentence; and
calculating the respective average perplexity score based on a sum of logarithms of scores corresponding to the first set of tokens and scores corresponding to the second set of tokens.

12. The system of claim 10, wherein the machine executable code further causes the one or more processors to:
designate a root node of the directed acyclic graph representing the input sentence;
designate a first lower level of nodes that are directly connected to the root node to a first set of candidate intermediate sentences, respectively, each candidate intermediate sentence from the first set being obtained after deleting the one or more tokens from the input sentence; and
for each outgoing edge connecting from the root node to one of the first lower level of nodes, assign a respective average perplexity score based on a respective candidate intermediate sentence.

13. The system of claim 12, wherein the machine executable code further causes the one or more processors to progressively searching for the next deletion on the directed acyclic graph representation via progressive lookahead greedy search by:
determining a first node from the first lower level corresponding to a first next candidate intermediate sentence having a first minimum average perplexity score among the first set of candidate intermediate sentences the next deletion; and
adding the first node to the deletion path.

14. The system of claim 13, wherein the machine executable code further causes the one or more processors to:
designate a second lower level of nodes that are directly connected to the first node to a second set of candidate intermediate sentences, respectively, each candidate intermediate sentence from the second set being obtained after further deleting one or more tokens from the first next candidate intermediate sentence;
determine a second node from the second lower level corresponding to a second next candidate intermediate sentence having a second minimum average perplexity score among the second set of candidate intermediate sentences the next deletion; and
add the second node to the deletion path.

15. The system of claim 10, wherein the machine executable code further causes the one or more processors to progressively search for a next deletion on the directed acyclic graph representation via progressive lookahead greedy search by:
setting a first deletion length; and
determining the directed graph representation having the plurality of nodes corresponding to candidate intermediate sentences based on the first deletion length;
determining whether at least one candidate intermediate sentence from the directed acyclic graph representation corresponds to a score that satisfies a predetermined threshold condition; and
in response to determining that no candidate intermediate sentence from the directed acyclic graph representation has the score satisfying the predetermined threshold condition, re-setting the first deletion length to a second deletion length that is greater than the first deletion length.

16. The system of claim 15, wherein the predetermined threshold condition includes: a ratio between a first average perplexity score corresponding to a next probing step and a second average perplexity score corresponding to a current probing step is greater than a pre-determined threshold.

17. The system of claim 16, wherein the machine executable code further causes the one or more processors to:
apply a parameter relating to the length of the current sentence to the first average perplexity score while evaluating the predetermined threshold condition.

18. The system of claim 17, wherein the machine executable code further causes the one or more processors to:
tune the parameter to control an extent of deletion rate of the deletion path.

* * * * *